(12) United States Patent  
Davis

(10) Patent No.: US 6,367,851 B1
(45) Date of Patent: Apr. 9, 2002

(54) ONE PIECE METER LOCKING RING FOR USE WITH MULTIPLE LOCKS

(75) Inventor: Jeffrey Mark Davis, Houston, TX (US)

(73) Assignee: DeWalch Technologies, Inc., Houston, TX (US)

( * ) Notice: Subject to any disclaimer, the term of this patent is extended or adjusted under 35 U.S.C. 154(b) by 0 days.

(21) Appl. No.: 09/490,675

(22) Filed: Jan. 24, 2000

Related U.S. Application Data

(62) Division of application No. 09/080,833, filed on May 18, 1998, now Pat. No. 6,032,989.

(51) Int. Cl.[7] .............................................. B65D 45/30
(52) U.S. Cl. .................... 292/256.6; 292/327; 70/19; 70/168; 70/DIG. 63
(58) Field of Search .................. 292/256.6, 256.63, 292/327; 70/14, 19, 18, 180, 163, 232, 166–169, DIG. 63, 337

(56) References Cited

U.S. PATENT DOCUMENTS

| | | | | |
|---|---|---|---|---|
| 256,079 A | * | 4/1882 | Trackwell | 70/18 |
| 2,963,895 A | * | 12/1960 | Thomas | 70/18 |
| 3,867,822 A | * | 2/1975 | Morse et al. | 70/164 |
| 3,889,497 A | * | 6/1975 | Tuttle | 70/14 |
| 3,913,959 A | * | 10/1975 | Larkin | 292/256.6 |
| 3,988,031 A | * | 10/1976 | Meyer | 292/153 |
| 4,008,585 A | * | 2/1977 | Lundberg | 70/164 |
| 4,085,599 A | * | 4/1978 | Fischer et al. | 70/14 |
| 4,329,860 A | * | 5/1982 | Moberg | 70/164 |
| 4,331,012 A | * | 5/1982 | Swisher | 70/164 |
| 4,413,490 A | * | 11/1983 | Nielsen, Jr. | 70/164 |
| 4,415,190 A | * | 11/1983 | Finck, Jr. et al. | 292/256.6 |
| 4,446,603 A | * | 5/1984 | Guiler | 24/21 |
| 4,543,807 A | * | 10/1985 | Swishen | 70/34 |
| 4,674,304 A | * | 6/1987 | Guiler | 70/164 |
| 4,697,443 A | * | 10/1987 | Hillin | 70/121 |
| 4,742,703 A | * | 5/1988 | DeWalch et al. | 70/366 |
| 4,828,300 A | * | 5/1989 | Agbay | 292/256.6 |
| 5,001,912 A | * | 3/1991 | DeWalch | 70/164 |
| 5,121,953 A | * | 6/1992 | Mahaney | 292/256.6 |
| 5,475,993 A | * | 12/1995 | Kwo | 70/18 |
| 5,542,722 A | * | 8/1996 | DeWalch | 292/256.6 |
| 5,613,386 A | * | 3/1997 | Mire, Sr. | 70/232 |
| 5,642,635 A | * | 7/1997 | Wen-Chyun | 70/46 |
| 5,743,110 A | * | 4/1998 | Suster | 70/14 |

* cited by examiner

Primary Examiner—Teri Pham Luu

(57) ABSTRACT

A locking ring includes an annular ring portions with a U-shaped cross section. The locking ring serves to retain an electric meter in its meter socket in a manner which is well known. Both ends of the ring portion terminate in front housings, each housing having an axial lock receiving aperture therethrough. The locking ring further includes a free floating rear housing with two lock receiving apertures therethrough. When the ring ends are brought together, the front housings slide over the rear housing until their lock receiving apertures are in axial alignment. A barrel lock can then be inserted into each of the two sets of aligned apertures, to secure the locking ring against opening. When a barrel lock is removed from either set of apertures, the ring can be opened and removed from the meter.

3 Claims, 5 Drawing Sheets

ONE PIECE METER LOCKING RING FOR USE WITH MULTIPLE LOCKS

This Applin is a Div. of Ser. No. 09/080,833 field May 18, 1998 now U.S. Pat. No. 6,032,989.

BACKGROUND

1. Field of the Invention

The present invention relates in general to locking rings for securing electricity meters, and more specifically to a meter locking ring with two or more receptacles therein for receiving a plurality of barrel type locks.

2. Problems Addressed by the Invention

In the electric utility industry, meter locking rings and barrel locks are utilized to deter vandals and to prevent potential power thieves from stealing electricity by altering electricity meter readings or bypassing the meters entirely. Locking rings, such as the one shown in U.S. Pat. No. 5,542,722 (1996, DeWalch), are used to secure the electricity meters to the meter bases. These rings usually comprise an annular split ring with a generally U-shaped cross section, and a lock receiving assembly which prevents separation of the ends of the split ring when secured with a barrel type lock such as the disc tumbler lock shown in U.S. Pat. No. 4,742,703 (1988, DeWalch et al) or the plunger style lock shown in U.S. Pat. No. 4,543,807 (1985, Swisher). A particular style of barrel lock and key is also referred to as a locking system. It should be noted that many more locking systems in addition to those listed here are available. Furthermore, many of these locking systems can be individually coded, resulting in literally thousands of potential permutations of locking systems and codes.

Until recently, the separate functions of power generation, distribution, metering, and billing in most regions of the U.S. were performed by a single entity, usually the local utility distribution company (UDC). Deregulation of the electric power utility industry in many areas has resulted in the distribution of these functions among several independent entities. For example, power generation, distribution and customer service might be handled by an energy service provider (ESP), while meter installation would be done by the metering service provider (MSP). In this and similar situations, it may become necessary for the UDC, ESP and MSP all to have independent access to the electricity meters.

Usually the UDC will secure each meter in its socket with a meter ring of the general type described above, and then lock the ring with a barrel lock from a particular locking system. In order to gain access to these meters, all service/installation personnel from the ESP or MSP must be provided with keys for that locking system. However, some ESPs and MSPs may supply services to dozens of UDCs, with each UDC selecting its own locking system. In such a situation, the ESP or MSP service personnel must be provided with a separate key for the locking system of every UDC they service. To further complicate the issue, the UDCs periodically update their lock codes or even change locking systems all together, requiring the ESPs and MSPs to retrain their service personnel and supply them with additional keys for the new locking system.

Given the vast number of locking systems and codes available, it is easy to see the potential for confusion and costly delays inherent in this scenario. What is needed is a method for securing electricity meters which utilizes a plurality of barrel locks, thereby allowing the UDC, ESP and MSP to select their locking systems independently, and to have independent access to the meters. This would allow the ESP or MSP to standardize on a single locking system for all of the meters it services, thereby greatly reducing the number of keys which must be supplied to its service personnel, and enhancing the timeliness and efficiency of service.

3. Discussion of Prior Art

In order to provide background information so that the invention may be completely understood in its proper context, reference is made to the following articles of prior art. In many locking rings, such as the ones shown in U.S. Pat. No. 4,413,490 (1983, Nielsen, Jr.), U.S. Pat. No. 4,008,585 (1977, Lundberg), U.S. Pat. No. 4,674,304 (1987, Guiler), U.S. Pat. No. 3,867,822 (1975, Morse et al.), and U.S. Pat. No. 4,329,860 (1982, Moberg), the ends of the annular split ring portion are held together by a screw. A single barrel lock is then used to secure a separate protective housing which covers the ends of the split ring and prevents access to the screw.

Another type of locking ring has a male portion at one end and a female portion at the other end. A single barrel lock is used to directly secure the male and female portions together. Examples of this type of locking ring are shown in U.S. Pat. No. 4,828,300 (1989, Agbay), U.S. Pat. No. 4,446,603 (1984, Guiler), and U.S. Pat. No. 4,415,190 (1983, Finck, Jr. et al). The locking ring shown in the U.S. Pat. No. 5,542,722 (DeWalch) has overlapping portions on each end which are retained together by a single barrel lock. Whatever the precise merits, features, and advantages of the above cited references, they do not achieve or fulfill the purposes or objects of the present invention as set forth below.

SUMMARY OF THE INVENTION

OBJECTS OF THE INVENTION

Accordingly, several objects and advantages of the present invention are: (a) To provide a locking ring which is adapted to receive a plurality of barrel locks, and can be opened by unlocking and removing any one of said barrel locks. (b) To provide a locking ring which provides a high level of security.

Brief Physical Description

The locking ring of the present invention comprises an annular ring with a U-shaped cross section, which fits over the radially extending, circular flanges of an electricity meter and base, and secures the meter to the base in a manner which is well known. Each end of the ring is formed into an L-shaped wall portion, with the longer leg of each wall portion extending radially outward. The shorter legs extend generally perpendicularly to the longer legs and towards each other. When the ends of the ring are brought together, the L-shaped wall portions form a generally rectangular enclosure. The U-shaped cross section of the ring material continues throughout the L-shaped protrusions, so that there is an internal lip along both the front and rear perimeters of the rectangular enclosure.

On each ring end, the L-shaped wall portion combines with a substantially solid front housing to form a front end protrusion. Each of the front housings contains a hole for receiving the barrel lock and an external groove for receiving a lip of the ring material. When the locking ring is viewed from the front, each front housing covers about half the area of the rectangular enclosure. The locking ring also includes a free floating rear housing, which has generally the same shape as the rectangular enclosure. The rear housing includes an external groove for receiving the lip of the ring material, and two holes for receiving barrel locks. When the locking ring is installed on the meter, the two ends of the ring are brought together, and each front housing slides over the rear housing until each lock receiving hole in the front housings aligns with one of the holes in the rear housing to receive the barrel locks. When the barrel locks are installed, they prevent the two ends of the meter ring from being separated, and thus secure the ring to the meter. When a barrel lock is removed from either set of aligned holes, the meter ring can be opened and removed from the meter.

Present Invention vs. Prior Art

The locking ring of the present invention comprises two separate lock receiving openings. All of the prior art meter rings are adapted to receive only a single barrel lock.

How the Present Invention Fulfills the Objects

The locking ring of the present invention comprises two separate lock receiving openings. These lock receiving openings are configured such that removal of either lock allows the ring to be opened and removed from the meter. The overlapping housing design of the present invention offers a high level of security, because pry points have been minimized.

DETAILED DESCRIPTION OF THE PREFERRED EMBODIMENT

Figure 1:
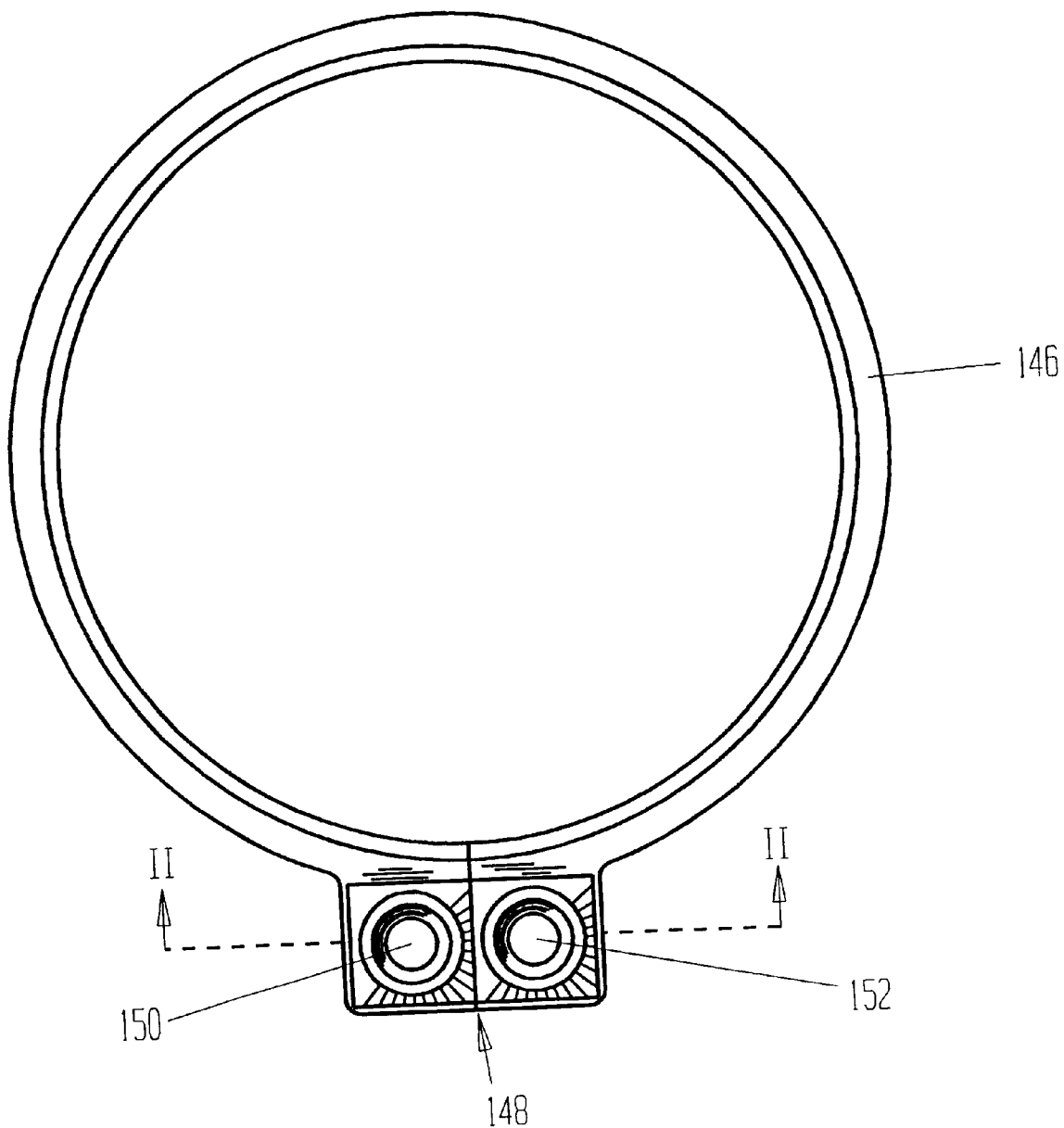
FIG. 1 shows a top view of the preferred embodiment meter ring.
Figure 2:
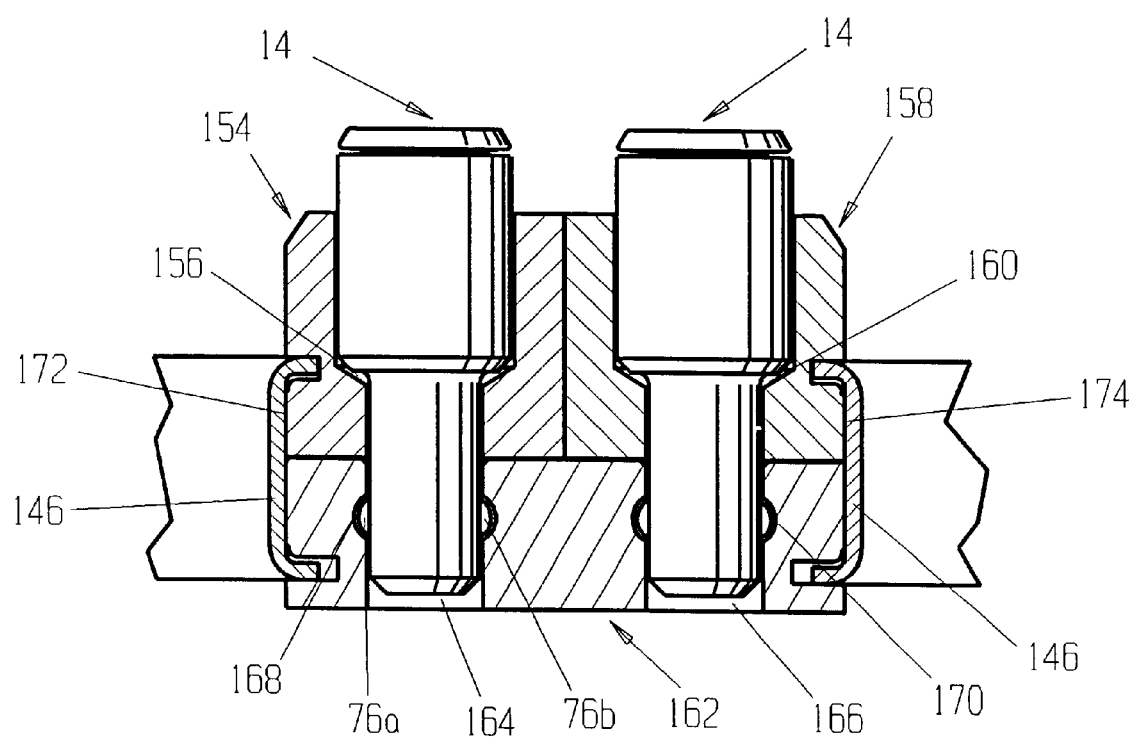
FIG. 2 shows a cross sectional view of the ends of the preferred embodiment locking ring.
Figure 3A:
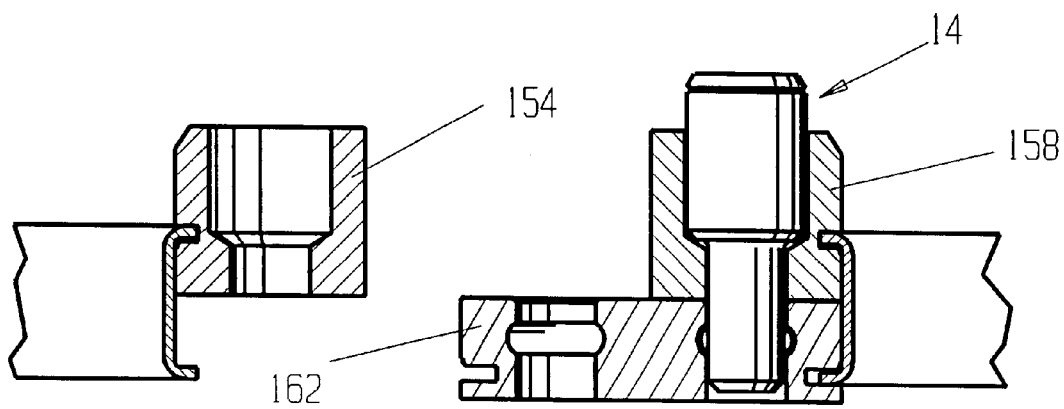
FIGS. 3a and 3b show cross sectional views of the ends of the preferred embodiment locking ring in two possible open positions.
Figure 3B:
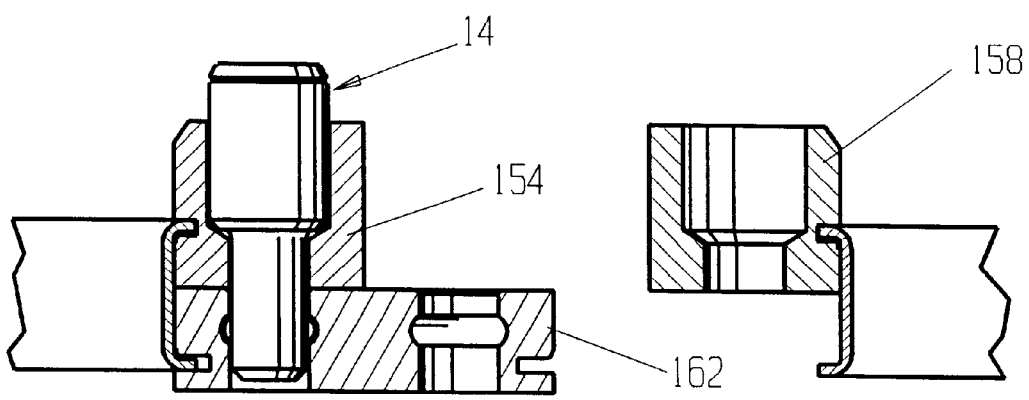

FIG. 1 shows an alternative embodiment meter ring having a one piece ring portion 146 and a housing assembly 148 with two lock receiving openings 150 and 152 extending generally parallel to the axis of the ring portion. Referring to FIG. 2, the housing assembly comprises a left front housing 154 having a lock receiving aperture 156, a right front housing 158 having a lock receiving aperture 160, and a rear housing 162 having two lock receiving apertures 164 and 166 with internal grooves 168 and 170 adapted to engage the locking means 76a and 76b of the barrel locks 14. The left front housing 154 is welded or otherwise permanently attached the ring portion 146 at 172. The right front housing 158 is welded or otherwise permanently attached the ring portion at 174. The rear housing 162 is free floating and is not attached to the ring. When the meter ring is closed, the lock receiving aperture 156 in the left front housing 154 is in axial alignment with the lock receiving aperture 164 in the rear housing 162. Similarly, the lock receiving aperture 160 in the right front housing 158 is in axial alignment with the lock receiving aperture 166 in the rear housing. The barrel locks can then be inserted into the combined apertures 150 and 152. Referring to FIG. 3a, when the left-most barrel lock is removed, the left front housing 154 can be separated from the right front housing 158 and the rear housing 162, allowing the meter ring to be opened and removed from the meter. Referring to FIG. 3b, when the right-most barrel lock is removed, the right front housing 158 can be separated from the left front housing 154 and the rear housing 162, allowing the meter ring to be opened and removed from the meter.

Alternative Embodiments

Figure 4:
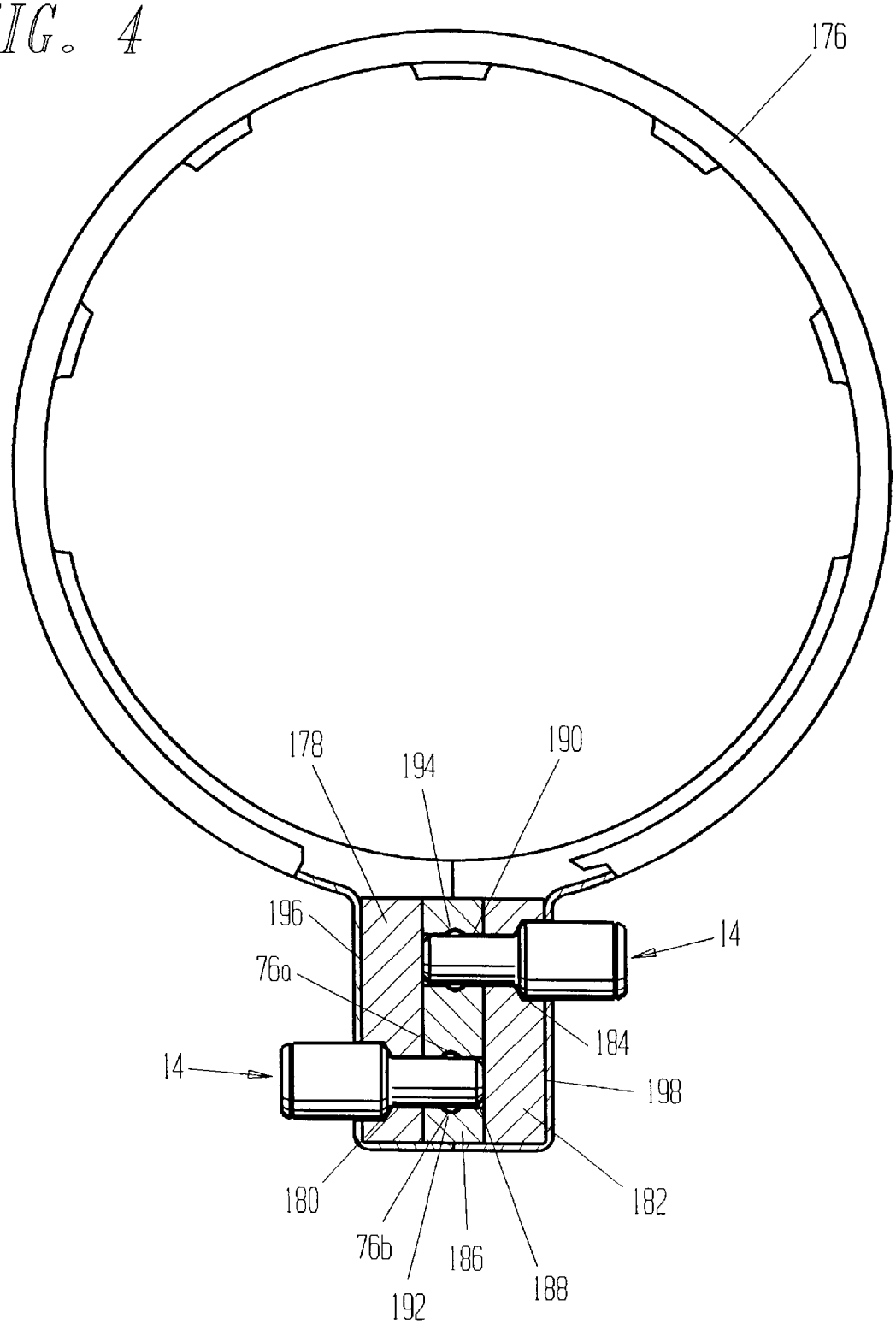
FIG. 4 shows a top partial cross-sectional view of an alternative embodiment locking ring having a single ring portion, two side housings attached to the ring ends, and a free floating center housing with two transverse lock receiving openings.
Figure 5A:
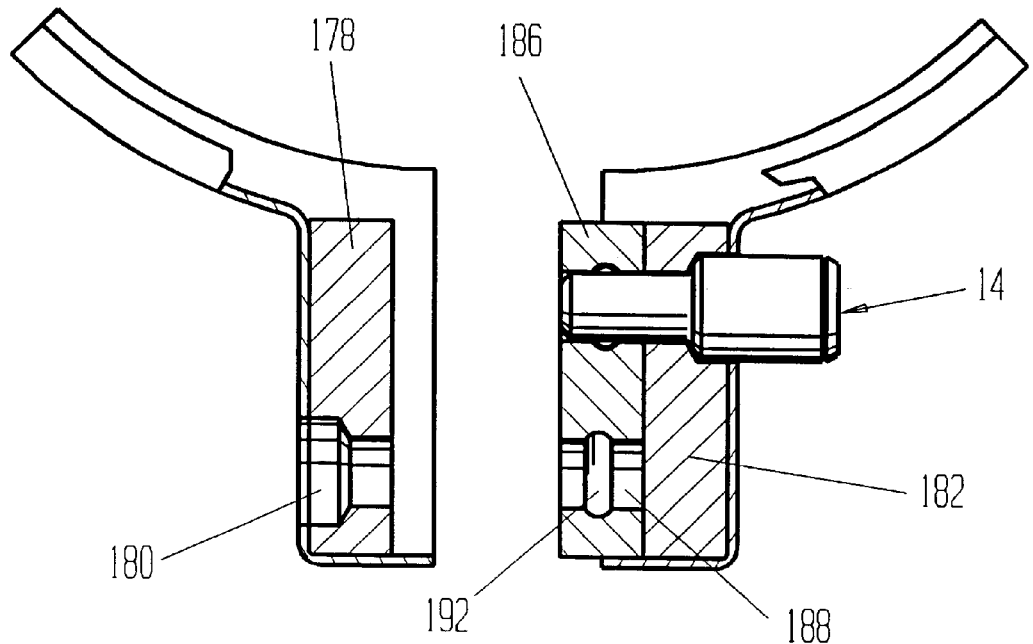
FIGS. 5a and 5b show cross sectional views of the ends of the alternative embodiment locking ring shown in FIG. 4 in two possible open positions.
Figure 5B:
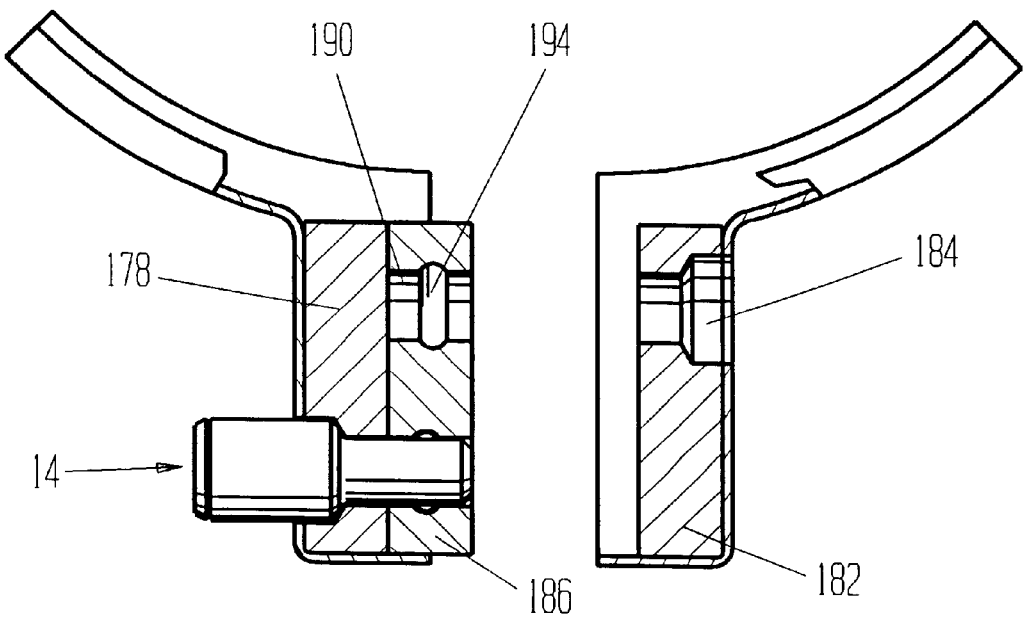

FIG. 4 shows an alternative embodiment meter ring having a one piece ring portion 176, a left housing 178 having a transverse lock receiving aperture 180, a right housing 182 having a transverse lock receiving aperture 184, and a center housing 186 having two transverse lock receiving apertures 188 and 190 with internal grooves 192 and 194 adapted to engage the locking means 76a and 76b of the barrel locks 14. The left housing 178 is welded or otherwise permanently attached the ring portion at 196. The right housing 182 is welded or otherwise permanently attached the ring portion at 198. The center housing 186 is free floating and is not attached to the ring. When the meter ring is closed, the lock receiving aperture 180 in the left housing 178 is in axial alignment with the lock receiving aperture 188 in the center housing 186. Similarly, the lock receiving aperture 184 in the right housing 182 is in axial alignment with the lock receiving aperture 190 in the center housing. The barrel locks 14 can then be inserted into the aligned apertures. Referring to FIG. 5a, when the left-most barrel lock is removed, the left housing 178 can be separated from the right housing 182 and the center housing 186, allowing the meter ring to be opened and removed from the meter. Referring to FIG. 5b, when the right-most barrel lock is removed, the right housing 182 can be separated from the left housing 178 and the center housing, allowing the meter ring to be opened and removed from the meter.

Conclusions, Ramifications, and Scope of the Invention

The present invention is well adapted to carry out the objects and attain the ends and advantages mentioned, as well as others inherent therein. The locking ring of the present invention is adapted to receive a plurality of barrel locks. The locking ring can be opened by removing one or several of the barrel locks, allowing independent access to electricity meters by several entities, while still providing a high level of security. While, for the purposes of disclosure there have been shown and described what are considered at present to be the preferred embodiments of the present invention, it will be appreciated by those skilled in the art that other uses may be resorted to and changes may be made to the details of construction, combination of shapes, size or arrangement of the parts, or other characteristics without departing from the spirit and scope of the invention. It is therefore desired that the invention not be limited to these embodiments and it is intended that the appended claims cover all such modifications as fall within the true spirit and scope of the invention.

What is claimed is:

1. A locking ring for detachably interconnecting two axially aligned, radially extending circular flanges, said locking ring including:

a) an annular ring having a central axis, a front side defined by the furthest extent of said annular ring along said axis in one direction, a rear side defined by the furthest extent of said annular ring along said axis in the opposite direction, a first end and a second end, said first and second ends being resiliently separable;

b) a first housing rigidly attached to said first end of said annular ring, said first front housing having at least one aperture therethrough;

c) a second housing rigidly attached to said second end of said annular ring, said second housing having at least one aperture therethrough;

d) a third housing proximate to each of said first and second housings, said third housing being separable from each of said first and second housings, said third housing including at least one aperture aligned with one of said apertures in said first housing to form a first combined aperture, and said third-housing including at least one aperture aligned with one of said apertures in said second housing to form a second combined aperture; and e) at least two barrel locks, each barrel lock including a head portion, a smaller diameter shank portion, and retaining means retractably extending from said shank portion, at least one of said barrel locks being disposed in each of said combined apertures.

2. The locking ring of claim 1, wherein:

a) said first housing and second housings are attached generally at said front side of said annular ring;

b) said third housing is disposed behind said first and second housings generally at said rear side of said annular ring; and c) said combined apertures extend generally parallel to said central axis of said annular ring.

3. The locking ring of claim 1, wherein:

a) said third housing is disposed generally between said first and second housings; and b) said combined apertures extend generally perpendicularly to said central axis of said annular ring.

* * * * *